(12) United States Patent
Cheng et al.

(10) Patent No.: US 11,178,351 B1
(45) Date of Patent: Nov. 16, 2021

(54) READOUT CIRCUIT FOR PIXEL

(71) Applicant: Novatek Microelectronics Corp., Hsinchu (TW)

(72) Inventors: Kuo Wei Cheng, Hsinchu (TW); Chi-Ting Chen, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/869,584

(22) Filed: May 7, 2020

(51) Int. Cl.
*H04N 5/378* (2011.01)
*H04N 5/357* (2011.01)
*H01L 27/146* (2006.01)
*H04N 5/3745* (2011.01)

(52) U.S. Cl.
CPC ....... *H04N 5/378* (2013.01); *H01L 27/14612* (2013.01); *H01L 27/14643* (2013.01); *H04N 5/3575* (2013.01); *H04N 5/37457* (2013.01)

(58) Field of Classification Search
CPC .. H04N 5/378; H04N 5/3575; H04N 5/37457; H01L 27/14612; H01L 27/14643
See application file for complete search history.

(56) References Cited

U.S. PATENT DOCUMENTS

| 10,290,673 | B1 * | 5/2019 | Wang | H04N 5/3742 |
| 2002/0011554 | A1 * | 1/2002 | Brehmer | H04N 5/376 250/208.1 |
| 2006/0011807 | A1 * | 1/2006 | Lee | H04N 5/3658 250/208.1 |
| 2009/0101798 | A1 * | 4/2009 | Yadid-Pecht | H04N 5/3559 250/208.1 |
| 2014/0043510 | A1 * | 2/2014 | Kasuga | H04N 5/363 348/300 |
| 2020/0389614 | A1 * | 12/2020 | Benjaram | H01L 27/14603 |

\* cited by examiner

*Primary Examiner* — Albert H Cutler
(74) *Attorney, Agent, or Firm* — JCIPRNET

(57) ABSTRACT

A readout circuit is provided. The readout circuit is coupled to a pixel circuit for reading out signals from the pixel circuit. The readout circuit includes a biasing circuit. The biasing circuit includes a cascode transistor and a biasing transistor. A first terminal of the cascode transistor is coupled to an output terminal of the biasing circuit and the pixel circuit. A second terminal of the cascode transistor is coupled to a first terminal of the biasing transistor. A second terminal of the biasing transistor is coupled to a negative voltage.

8 Claims, 3 Drawing Sheets

READOUT CIRCUIT FOR PIXEL

BACKGROUND

Technical Field

The disclosure relates to a circuit, and particularly relates to a readout circuit.

Description of Related Art

In general, because the effective voltage range of the floating diffusion node in the pixel circuit of the image senor is limited by the output voltage swing (OVS) of the readout circuit, the sensing signal provided by the photo diode of the pixel circuit may be truncated, and further causes the image distortion. Therefore, regarding how to make the readout circuit have a wide output voltage swing, solutions of several embodiments are provided below.

SUMMARY

The disclosure is directed to a readout circuit, and is capable of effectively reading out signals from a floating diffusion node of a pixel circuit.

The readout circuit of the disclosure is adapted to couple to a pixel circuit for reading out signals from the pixel circuit. The readout circuit includes a biasing circuit. The biasing circuit includes a cascode transistor and a biasing transistor. A first terminal of the cascode transistor is coupled to an output terminal of the biasing circuit and the pixel circuit. A second terminal of the cascode transistor is coupled to a first terminal of the biasing transistor. A second terminal of the biasing transistor is coupled to a negative voltage.

Based on the above, according to the readout circuit of the disclosure, the readout circuit is coupled to the negative voltage, so as to provide a signal readout function with a high dynamic range effect.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

It is to be understood that other embodiments may be utilized and structural changes may be made without departing from the scope of the disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
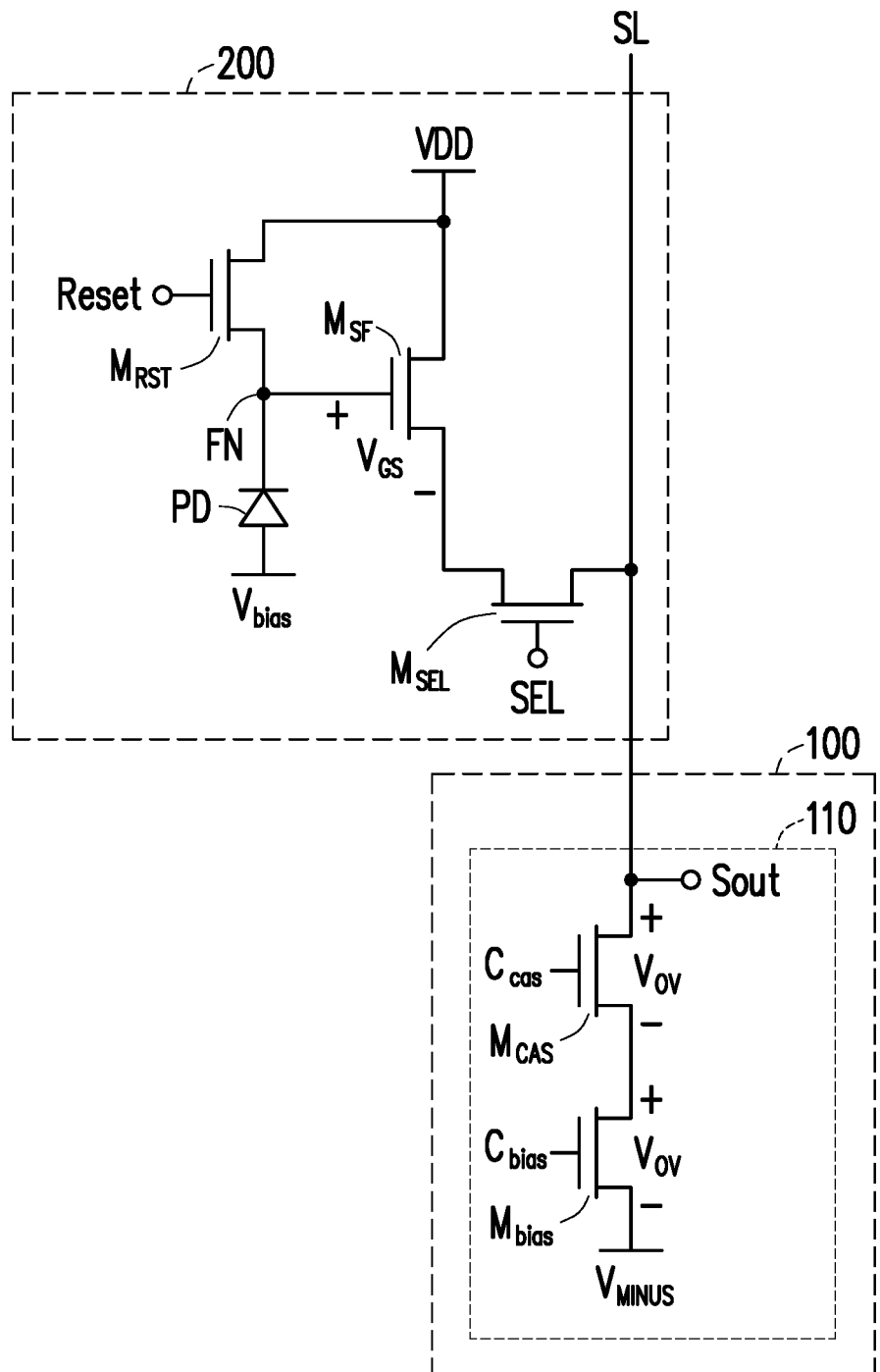
FIG. 1 is a schematic diagram illustrating a readout circuit and a pixel circuit according to an embodiment of the disclosure.

FIG. 1 is a schematic diagram illustrating a readout circuit and a pixel circuit according to an embodiment of the disclosure. Referring to FIG. 1, the readout circuit 100 includes a biasing circuit 110. The readout circuit 100 may be integrated into an integrated chip (IC), such as a fingerprint sensor IC. The biasing circuit 110 includes a cascode transistor $M_{CAS}$ and a biasing transistor $M_{bias}$. A first terminal of the cascode transistor $M_{CAS}$ is coupled to an output terminal Sout of the biasing circuit 110 and the pixel circuit 200, and a second terminal of the cascode transistor $M_{CAS}$ is coupled to a first terminal of the biasing transistor $M_{bias}$. A second terminal of the biasing transistor $M_{bias}$ is coupled to a negative voltage $V_{MINUS}$. In the embodiment of the disclosure, a control terminal of the cascode transistor $M_{CAS}$ receives a control signal $C_{cas}$, and a control terminal of the cascode transistor $M_{bias}$ receives a control signal $C_{bias}$. The biasing transistor $M_{bias}$ is configured to provide a biasing current for the pixel circuit, and the cascode transistor $M_{CAS}$ is configured to clamp the drain voltage of the biasing transistor $M_{bias}$, so that the biasing current is not affected by the voltage change of the output terminal Sout. Thus, the control signal $C_{cas}$ and the control signal $C_{bias}$ may be a fixed voltage respectively, and the cascode transistor $M_{CAS}$ has the same transistor characteristics as the biasing transistor $M_{bias}$. In the embodiment of the disclosure, owing to the second terminal of the biasing transistor $M_{bias}$ is coupled to a negative voltage $V_{MINUS}$, the pixel circuit 200 is able to provide a wide output voltage swing (OVS) by the output terminal Sout.

In the embodiment of the disclosure, the pixel circuit 200 may configured to sense a fingerprint image. In other words, in other embodiments of the disclosure, the readout circuit 100 may applied to a fingerprint sensor. The fingerprint sensor may include a pixel array, and the pixel array includes a plurality of pixel circuits, such as the pixel circuit 200 in FIG. 1. Each column of the pixel array may respectively include one single line, such as signal line SL, and multiple rows of pixel circuits. Thus, the each single line of fingerprint sensor is coupled to one readout circuit, such as the readout circuit 100 in FIG. 1, and the one readout circuit is configured to time-sharing read out the signals of the multiple rows of pixel circuits after select transistor of each of the multiple rows of pixel circuits be time-sharing turned on.

In the embodiment of the disclosure, the pixel circuit 200 is an active pixel sensor, but the disclosure is not limited thereto. The pixel circuit 200 may include a reset transistor $M_{RST}$, a photo diode PD, a source follower transistor $M_{SF}$ and a select transistor $M_{SEL}$. The reset transistor $M_{RST}$, the source follower transistor $M_{SF}$ and the select transistor $M_{SEL}$ may be a metal-oxide-semiconductor field effect transistor (MOSFET) respectively. A first terminal of the reset transistor $M_{RST}$ is coupled to a supply voltage VDD, and a second terminal of the reset transistor $M_{RST}$ is coupled to a floating diffusion node FN. A first terminal of the photo diode PD is coupled to the floating diffusion node FN, and a second terminal of the photo diode PD is coupled to a bias voltage $V_{bias}$. A first terminal of the source follower transistor $M_{SF}$ is coupled to the supply voltage VDD, and a control terminal of the source follower transistor $M_{SF}$ is coupled to the floating diffusion node FN. A first terminal of the select transistor $M_{SEL}$ is coupled to a second terminal of the source follower transistor $M_{SF}$, and a second terminal of the select transistor $M_{SEL}$ is coupled to the first terminal of the cascode transistor $M_{CAS}$ and the output terminal Sout through signal line SL.

In the embodiment of the disclosure, during a sampling period, the reset transistor $M_{RST}$ is turned off, and a control terminal of the select transistor $M_{SEL}$ receives a select signal SEL so as to be turned on. The photo diode PD generates a photocurrent (dark current) during an exposure period, so cause the voltage of the photo diode PD to drop. Thus, the voltage of the floating diffusion node FN may be correspondingly changed based on the voltage of the photo diode PD, and the select transistor $M_{SEL}$ outputs a sampling voltage corresponding to the voltage of the floating diffusion node FN to the readout circuit 100 through the signal line SL, so that the output terminal Sout outputs the sampling voltage to related analog front end circuits in the readout circuit 100. Furthermore, during a reset period, a control terminal of the reset transistor $M_{RST}$ receives a reset signal $S_{RST}$ so as to be turned on, and a control terminal of the select transistor $M_{SEL}$ receives the select signal SEL so as to be also turned on. The photo diode PD is reset by the supply voltage VDD, so the voltage of the photo diode PD is reset at the same time. Thus, select transistor $M_{SEL}$ outputs a background voltage corresponding to the voltage of the floating diffusion node FN to the readout circuit 100 through the signal line SL, so that the output terminal Sout outputs the background voltage to the analog front end in the readout circuit 100.

In the embodiment of the disclosure, the output voltage swing of the output terminal Sout meets the following equation (1), wherein the he symbol $2*V_{OV}$ is represented two overdrive voltages of the biasing transistor $M_{bias}$ and the cascode transistor $M_{CAS}$, and the symbol $V_{GS}$ is represented a gate-source voltage of the source follower transistor $M_{SF}$. Moreover, the effective voltage range $FN_{effective}$ of the floating diffusion node FN meets the following equation (2). It can be known from the equation (1) and equation (2), if the negative voltage $V_{MINUS}$ becomes lower, the effective voltage range of the floating diffusion node FN becomes larger. Thus, the following equation (3) can be derived by deriving the equation (1) and equation (2). Therefore, in the embodiment of the disclosure, the negative voltage $V_{MINUS}$ meets the following equation (3), so that the output terminal Sout can provide a wide output voltage swing accordingly. Furthermore, after considering the reliability of the cascode transistor $M_{CAS}$ and the biasing transistor $M_{bias}$, the negative voltage $V_{MINUS}$ may further be designed to meet the following equation (4).

$$V_{MINUS}+2\times V_{OV}\leq S_{out}\leq VDD-V_{GS} \quad (1)$$

$$V_{MINUS}+2\times V_{OV}+V_{GS}\leq FN_{effective}\leq VDD \quad (2)$$

$$V_{MINUS}\leq V_{bias}-2\times V_{OV}-V_{GS} \quad (3)$$

$$V_{MINUS}>-2\times V_{OV} \quad (4)$$

Figure 2:
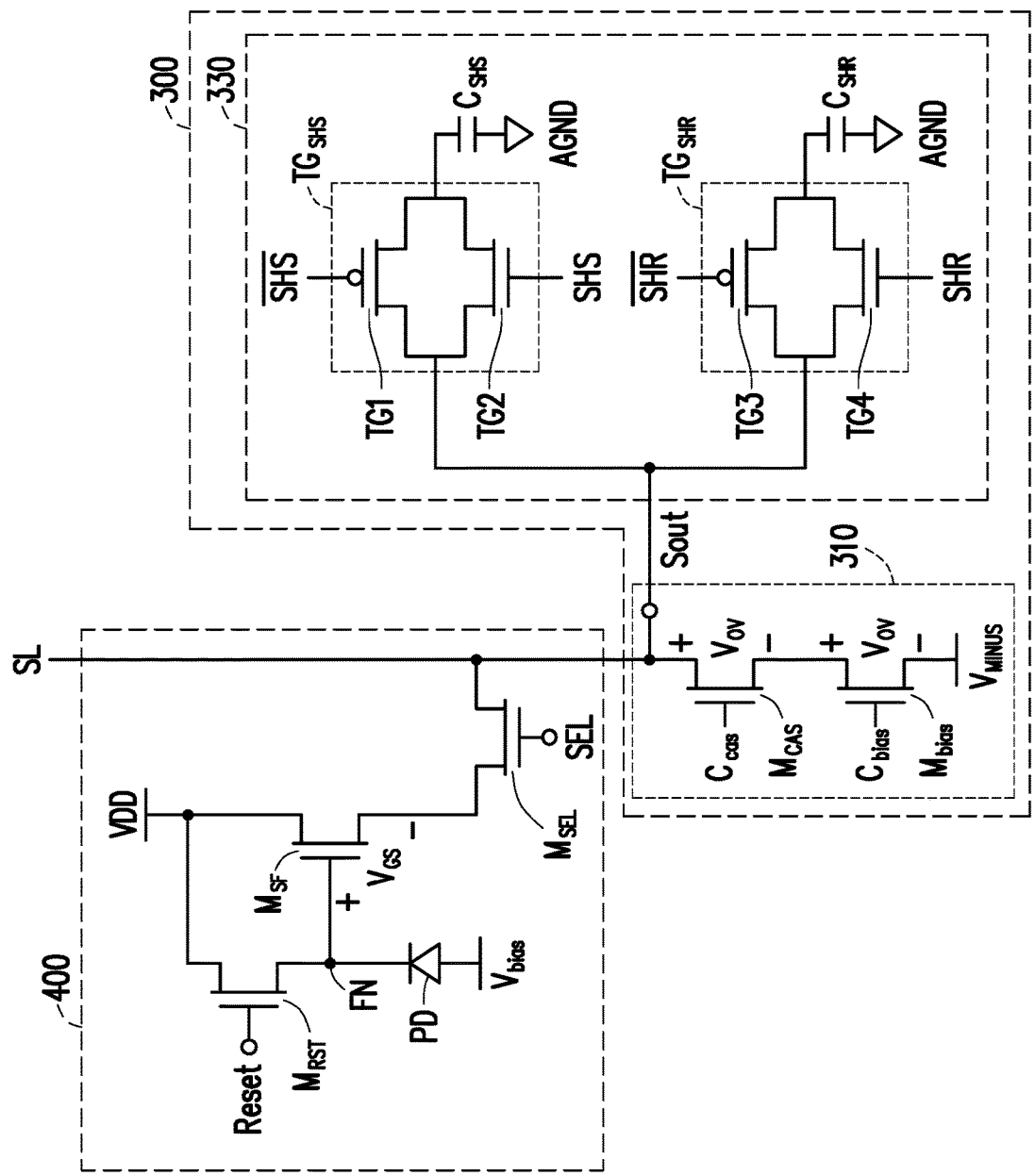
FIG. 2 is a schematic diagram illustrating a readout circuit and a pixel circuit according to another embodiment of the disclosure.

FIG. 2 is a schematic diagram illustrating a readout circuit and a pixel circuit according to another embodiment of the disclosure. Referring to FIG. 2, the readout circuit 300 includes a biasing circuit 310 and a correlated double sampling circuit 330. The biasing circuit 310 includes a cascode transistor $M_{CAS}$ and a biasing transistor $M_{bias}$. A first terminal of the cascode transistor $M_{CAS}$ is coupled to an output terminal Sout of the biasing circuit 310 and the pixel circuit 400, and a second terminal of the cascode transistor $M_{CAS}$ is coupled to a first terminal of the biasing transistor $M_{bias}$. A second terminal of the biasing transistor $M_{bias}$ is coupled to a negative voltage $V_{MINUS}$. In the embodiment of the disclosure, a control terminal of the cascode transistor $M_{CAS}$ receives a control signal $C_{cas}$, and a control terminal of the cascode transistor $M_{bias}$ receives a control signal $C_{bias}$. The pixel circuit 400 may include a reset transistor $M_{RST}$, a photo diode PD, a source follower transistor $M_{SF}$ and a select transistor $M_{SEL}$. A first terminal of the reset transistor $M_{RST}$ is coupled to a supply voltage VDD, and a second terminal of the reset transistor $M_{RST}$ is coupled to a floating diffusion node FN. A first terminal of the photo diode PD is coupled to the floating diffusion node FN, and a second terminal of the photo diode PD is coupled to a bias voltage $V_{bias}$. A first terminal of the source follower transistor $M_{SF}$ is coupled to the supply voltage VDD, and a control terminal of the source follower transistor $M_{SF}$ is coupled to the floating diffusion node FN. A first terminal of the select transistor $M_{SEL}$ is coupled to a second terminal of the source follower transistor $M_{SF}$, and a second terminal of the select transistor $M_{SEL}$ is coupled to the first terminal of the cascode transistor $M_{CAS}$ and the output terminal Sout through signal line SL. However, enough teachings, implementation details and technical features of the biasing circuit 310 and the pixel circuit 400 of the embodiment may be learned from related descriptions of the embodiments of FIG. 1, therefore details thereof are not repeated.

In the embodiment of the disclosure, the correlated double sampling circuit 330 includes a first switch circuit $TG_{SHS}$, a first capacitor $C_{SHS}$, a second switch circuit $TG_{SHR}$ and a second capacitor $C_{SHR}$. A first terminal of the first switch circuit $TG_{SHS}$ is coupled to the output terminal Sout of the biasing circuit 310. A first terminal of the first capacitor $C_{SHS}$ is coupled to a second terminal of the first switch circuit $TG_{SHS}$, and a second terminal of the first capacitor $C_{SHS}$ is coupled to a ground voltage AGND. A first terminal of the second switch circuit $TG_{SHR}$ is coupled to the output terminal Sout of the biasing circuit 310. A first terminal of the second capacitor $C_{SHR}$ is coupled to the second terminal of the second switch circuit $TG_{SHR}$, and a second terminal of the second capacitor $C_{SHR}$ is coupled to the ground voltage AGND. In the embodiment of the disclosure, the first capacitor $C_{SHS}$ is configured to receive a sample-and-hold signal (SHS) form the output terminal Sout so as to store the sampling voltage, and the second capacitor $C_{SHR}$ is configured to receive a sample-and-hold reset signal (SHR) form the output terminal Sout so as to store the background voltage.

In the embodiment of the disclosure, the first switch circuit $TG_{SHS}$ and second switch circuit $TG_{SHR}$ are a transmission gate circuit respectively, but the disclosure is not limited thereto. The first switch circuit $TG_{SHS}$ includes a first transistor TG1 and a second transistor TG2. The first transistor TG1 is a p-type transistor, and the second transistor TG2 is a n-type transistor. A first terminal of the first transistor TG1 is coupled to the output terminal Sout, and a second terminal of the first transistor TG1 is coupled to the first capacitor $C_{SHS}$. A first terminal of the second transistor TG2 is coupled to the output terminal Sout and the first terminal of the first transistor TG1, and a second terminal of the second transistor TG2 is coupled to the first capacitor $C_{SHS}$ and the second terminal of the first transistor TG1. A control terminal of the second transistor TG2 receives a switch signal $\overline{SHS}$, and a control terminal of the first transistor TG1 receives an inverting switch signal SHS. The second switch circuit $TG_{SHR}$ includes a third transistor TG3 and a fourth transistor TG4. The third transistor TG3 is a p-type transistor, and the fourth transistor TG4 is a n-type transistor. A first terminal of the third transistor TG3 is coupled to the output terminal Sout, and a second terminal of the third transistor TG3 is coupled to the second capacitor $C_{SHR}$. A first terminal of the fourth transistor TG4 is coupled to the output terminal Sout and the first terminal of the third transistor TG3, and a second terminal of the fourth transistor TG4 is coupled to the second capacitor $C_{SHR}$ and the second terminal of the third transistor TG3. A control terminal of the fourth transistor TG4 receives a switch signal SHR, and a control terminal of the third transistor TG3 receives an inverting switch signal $\overline{SHR}$.

In the embodiment of the disclosure, during the sampling period, the first switch circuit $TG_{SHS}$ is turned on and the second switch circuit $TG_{SHR}$ is turned off, so that the first capacitor $C_{SHS}$ stores the sampling voltage. Then, during the reset period, the first switch circuit $TG_{SHS}$ is turned off and the second switch circuit $TG_{SHR}$ is turned on, so that the second capacitor $C_{SHR}$ stores the background voltage. Thus, the other back-end image processing circuit can perform related image process by reading the first capacitor $C_{SHS}$ and the second capacitor $C_{SHR}$. However, the reliability of the first switch circuit $TG_{SHS}$ and the second switch circuit $TG_{SHR}$ should be considered. In the embodiment of the disclosure, the first to fourth transistors TG1-TG4 are a MOSFET respectively. Specifically, in the embodiment of the disclosure, owing to avoid the base-gate voltages of the second transistor TG2 and the fourth transistor TG4 being overstress and occurs the drain-base voltage leakage, besides the above equation (3) and (4), the voltage of the output terminal Sout should be higher than or equal to the ground voltage AGND. Therefore, in other embodiments of the disclosure, the negative voltage $V_{MINUS}$ may, for example, be designed to be equal to or approximately –0.6V (Volt), so that the output terminal Sout can provide a wide output voltage swing accordingly.

Figure 3:
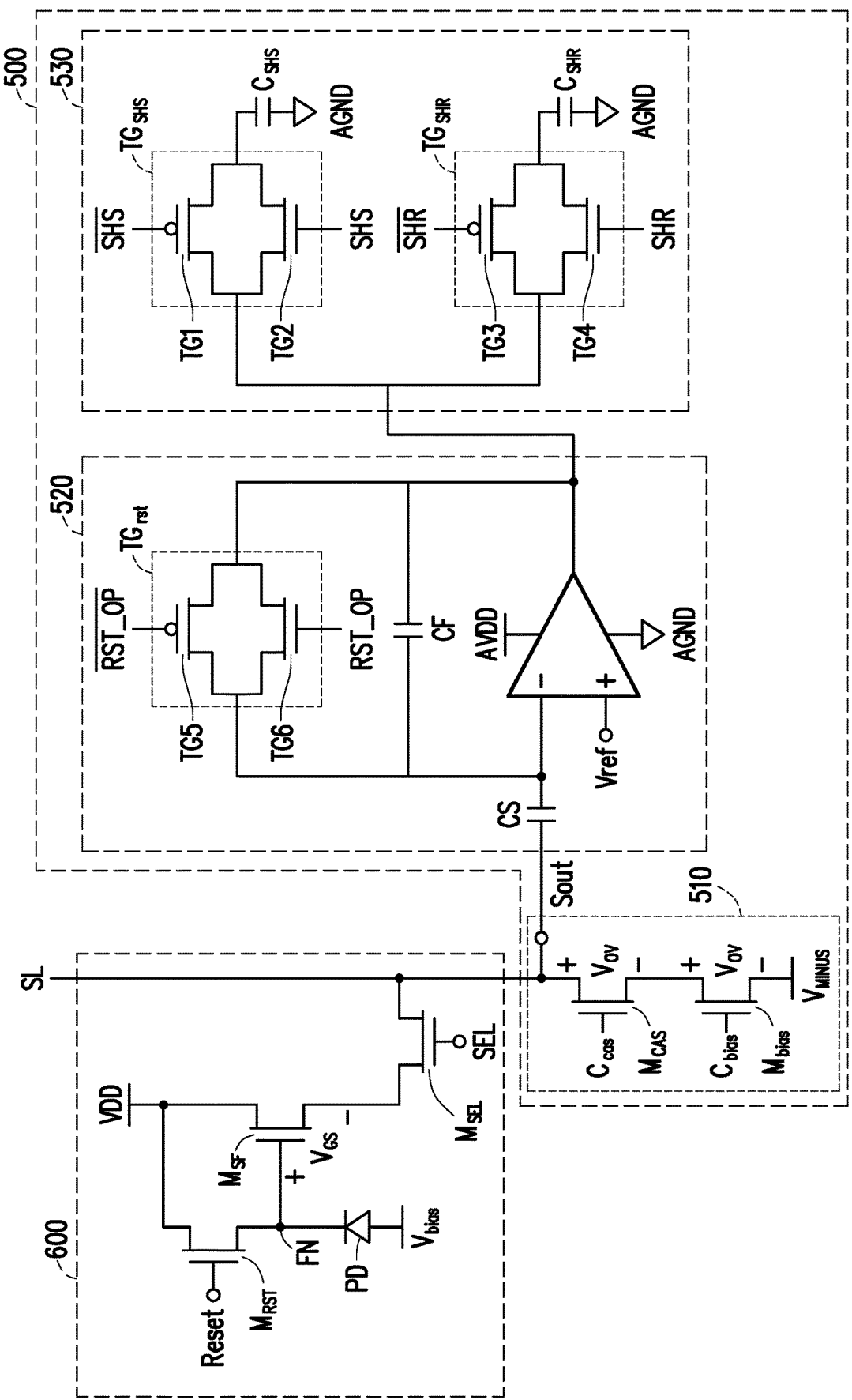
FIG. 3 is a schematic diagram illustrating a readout circuit and a pixel circuit according to yet another embodiment of the disclosure.

FIG. 3 is a schematic diagram illustrating a readout circuit and a pixel circuit according to yet another embodiment of the disclosure. Referring to FIG. 3, the readout circuit 500 includes a biasing circuit 510, a switch capacitor amplifier circuit 520 and a correlated double sampling circuit 530. The switch capacitor amplifier circuit 520 is coupled between the biasing circuit 510 and the correlated double sampling circuit 530. The biasing circuit 510 includes a cascode transistor $M_{CAS}$ and a biasing transistor $M_{bias}$. A first terminal of the cascode transistor $M_{CAS}$ is coupled to an output terminal Sout of the biasing circuit 510 and the pixel circuit 600, and a second terminal of the cascode transistor $M_{CAS}$ is coupled to a first terminal of the biasing transistor $M_{bias}$. A second terminal of the biasing transistor $M_{bias}$ is coupled to a negative voltage $V_{MINUS}$. In the embodiment of the disclosure, a control terminal of the cascode transistor $M_{CAS}$ receives a control signal $C_{cas}$, and a control terminal of the cascode transistor $M_{bias}$ receives a control signal $C_{bias}$. The pixel circuit 600 may include a reset transistor $M_{RST}$, a photo diode PD, a source follower transistor $M_{SF}$ and a select transistor $M_{SEL}$. A first terminal of the reset transistor $M_{RST}$ is coupled to a supply voltage VDD, and a second terminal of the reset transistor $M_{RST}$ is coupled to a floating diffusion node FN. A first terminal of the photo diode PD is coupled to the floating diffusion node FN, and a second terminal of the photo diode PD is coupled to a bias voltage $V_{bias}$. A first terminal of the source follower transistor $M_{SF}$ is coupled to the supply voltage VDD, and a control terminal of the source follower transistor $M_{SF}$ is coupled to the floating diffusion node FN. A first terminal of the select transistor $M_{SEL}$ is coupled to a second terminal of the source follower transistor $M_{SF}$, and a second terminal of the select transistor $M_{SEL}$ is coupled to the first terminal of the cascode transistor $M_{CAS}$ and the output terminal Sout through signal line SL. However, enough teachings, implementation details and technical features of the biasing circuit 510 and the pixel circuit 600 of the embodiment may be learned from related descriptions of the embodiments of FIG. 1, therefore details thereof are not repeated.

In the embodiment of the disclosure, the switch capacitor amplifier circuit 520 includes a series capacitor CS, an operational amplifier AP, a compensation capacitor CF and a third switch circuit $TG_{rst}$. A first terminal of the series capacitor CS is coupled to the output terminal of the biasing circuit 510. An inverting input terminal (−) of the operational amplifier AP is coupled to the second terminal of the series capacitor CS, a non-inverting input terminal (+) of the operational amplifier AP is coupled to a reference voltage Vref, and an output terminal of operational amplifier AP is coupled to the correlated double sampling circuit 530. A first terminal of the compensation capacitor CF is coupled to the inverting input terminal of the operational amplifier AP, and a second terminal of the compensation capacitor CF is coupled to the output terminal of the operational amplifier AP. A first terminal of the third switch circuit $TG_{rst}$ is coupled to the inverting input terminal of the operational amplifier AP, and a second terminal of the third switch circuit $TG_{rst}$ is coupled to the output terminal of the operational amplifier AP. The operational amplifier AP is operated at an operating voltage AVDD and the ground voltage AGND.

In the embodiment of the disclosure, the third switch circuit $TG_{rst}$ includes a fifth transistor TG5 and a sixth transistor TG6. The fifth transistor TG5 is a p-type transistor, and the sixth transistor TG6 is a n-type transistor. A first terminal of the fifth transistor TG5 is coupled to the inverting input terminal of the operational amplifier AP, and a second terminal of the fifth transistor TG5 is coupled to the output terminal of the operational amplifier AP. A first terminal of the sixth transistor TG6 is coupled to the inverting input terminal of the operational amplifier AP and the first terminal of the fifth transistor TG5, and a second terminal of the sixth transistor TG6 is coupled to the output terminal of the operational amplifier AP and the second terminal of the fifth transistor TG5. A control terminal of the sixth transistor TG6 receives a switch signal RST_OP, and a control terminal of the fifth transistor TG5 receives an inverting switch signal $\overline{RST\_OP}$.

In the embodiment of the disclosure, the correlated double sampling circuit 530 includes a first switch circuit $TG_{SHS}$, a first capacitor $C_{SHS}$, a second switch circuit $TG_{SHR}$ and a second capacitor $C_{SHR}$. A first terminal of the first switch circuit $TG_{SHS}$ is coupled to the output terminal Sout of the biasing circuit 510. A first terminal of the first capacitor $C_{SHS}$ is coupled to a second terminal of the first switch circuit $TG_{SHS}$, and a second terminal of the first capacitor $C_{SHS}$ is coupled to a ground voltage AGND. A first terminal of the second switch circuit $TG_{SHR}$ is coupled to the output terminal Sout of the biasing circuit 510. A first terminal of the second capacitor $C_{SHR}$ is coupled to the second terminal of the second switch circuit $TG_{SHR}$, and a second terminal of the second capacitor $C_{SHR}$ is coupled to the ground voltage AGND. In the embodiment of the disclosure, the first capacitor $C_{SHS}$ is configured to receive a sample-and-hold signal (SHS) form the output terminal Sout so as to store the sampling voltage, and the second capacitor $C_{SHR}$ is configured to receive a sample-and-hold reset signal (SHR) form the output terminal Sout so as to store the background voltage.

In the embodiment of the disclosure, the first switch circuit $TG_{SHS}$ and second switch circuit $TG_{SHR}$ are a transmission gate circuit respectively, but the disclosure is not limited thereto. The first switch circuit $TG_{SHS}$ includes a first transistor TG1 and a second transistor TG2. The first transistor TG1 is a p-type transistor, and the second transistor TG2 is a n-type transistor. A first terminal of the first transistor TG1 is coupled to the output terminal Sout, and a second terminal of the first transistor TG1 is coupled to the first capacitor $C_{SHS}$. A first terminal of the second transistor TG2 is coupled to the output terminal Sout and the first terminal of the first transistor TG1, and a second terminal of the second transistor TG2 is coupled to the first capacitor $C_{SHS}$ and the second terminal of the first transistor TG1. A control terminal of the second transistor TG2 receives a switch signal SHS, and a control terminal of the first transistor TG1 receives an inverting switch signal $\overline{SHS}$. The second switch circuit $TG_{SHR}$ includes a third transistor TG3 and a fourth transistor TG4. The third transistor TG3 is a p-type transistor, and the fourth transistor TG4 is a n-type transistor. A first terminal of the third transistor TG3 is coupled to the output terminal Sout, and a second terminal of the third transistor TG3 is coupled to the second capacitor $C_{SHR}$. A first terminal of the fourth transistor TG4 is coupled to the output terminal Sout and the first terminal of the third transistor TG3, and a second terminal of the fourth transistor TG4 is coupled to the second capacitor $C_{SHR}$ and the second terminal of the third transistor TG3. A control terminal of the fourth transistor TG4 receives a switch signal SHR, and a control terminal of the third transistor TG3 receives an inverting switch signal $\overline{SHR}$. However, enough teachings, implementation details and technical features of the correlated double sampling circuit 530 of the embodiment may be learned from related descriptions of the embodiments of FIG. 2, therefore details thereof are not repeated.

In the embodiment of the disclosure, during the sampling period, the switch signal RST_OP may be the operating voltage AVDD and the inverting switch signal $\overline{RST\_OP}$ may be the ground voltage AGND. Thus, the operational amplifier AP is operated in the unity-gain state, so as to store the sampling voltage in the series capacitor CS. Then, the switch signal RST_OP may be the ground voltage AGND and the inverting switch signal $\overline{RST\_OP}$ may be the operating voltage AVDD. Thus, the operational amplifier AP is operated in capacitive feedback state, so as to provide the sampling voltage stored in the series capacitor CS to the first capacitor $C_{SHS}$. Moreover, during the reset period, the switch signal RST_OP may be the operating voltage AVDD and the inverting switch signal $\overline{RST\_OP}$ may be the ground voltage AGND. Thus, the operational amplifier AP is operated in the unity-gain state, so as to store the background voltage in the series capacitor CS. Then, the switch signal RST_OP may be the ground voltage AGND and the inverting switch signal $\overline{RST\_OP}$ may be the operating voltage AVDD. Thus, the operational amplifier AP is operated in capacitive feedback state, so as to provide the background voltage stored in the series capacitor CS to the first capacitor $C_{SHR}$. However, since the output terminal Sout is coupled to the series capacitor CS is series and the operational amplifier AP feedback the reference voltage Vref, there is no need to further consider the reliability problem of the second transistor TG2, the fourth transistor TG4 and the sixth transistor TG6. Therefore, in the embodiment of the disclosure, the negative voltage $V_{MINUS}$ meets the above equations (3) and (4), so that the output terminal Sout can provide a wide output voltage swing accordingly.

In summary, the readout circuit of the disclosure is capable of providing a wide output voltage swing by specifically designing the negative voltage coupled to the biasing circuit. Therefore, the readout circuit of the disclosure can provide an effective signal readout function with a high dynamic range effect.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A readout circuit for reading out signals from a pixel circuit, comprising:
    a biasing circuit, comprising a cascode transistor and a biasing transistor,
    wherein a first terminal of the cascode transistor is coupled to an output terminal of the biasing circuit and the pixel circuit, a second terminal of the cascode transistor is coupled to a first terminal of the biasing transistor, and a second terminal of the biasing transistor is coupled to a negative voltage,
    wherein the pixel circuit further comprises:
    a reset transistor, wherein a first terminal of the reset transistor is coupled to a supply voltage, and a second terminal of the reset transistor is coupled to a floating diffusion node;
    a photo diode, wherein a first terminal of the photo diode is coupled to the floating diffusion node, and a second terminal of the photo diode is coupled to a bias voltage;
    a source follower transistor, wherein a first terminal of the source follower transistor is coupled to the supply voltage, and a control terminal of the source follower transistor is coupled to the floating diffusion node; and
    a select transistor, wherein a first terminal of the select transistor is coupled to a second terminal of the source follower transistor, and a second terminal of the select transistor is coupled to the first terminal of the cascode transistor,
    wherein the negative voltage meets a first equation: V_MINUS≤bias-2×V_OV-V_GS, wherein the symbol V_MINUS is represented the negative voltage, the symbol V_bias is represented a bias voltage received by a control terminal of the biasing transistor, the symbol 2*V_OV is represented two overdrive voltages of the biasing transistor and the cascode transistor, and the symbol V_GS is represented a gate-source voltage of the source follower transistor.

2. The readout circuit according to the claim 1, wherein the pixel circuit is an active pixel sensor.

3. The readout circuit according to the claim 1, wherein the negative voltage further meets a second equation: V_MINUS≥-V_GS.

4. The readout circuit according to the claim 1, further comprising:
    a correlated double sampling circuit, coupled to the output terminal of the biasing circuit.

5. The readout circuit according to the claim 4, wherein the correlated double sampling circuit comprises:
    a first switch circuit, wherein a first terminal of the first switch circuit is coupled to the output terminal of the biasing circuit;

a first capacitor, wherein a first terminal of the first capacitor is coupled to a second terminal of the first switch circuit, and a second terminal of the first capacitor is coupled to a ground voltage;

a second switch circuit, wherein a first terminal of the second switch circuit is coupled to the output terminal of the biasing circuit; and a second capacitor, wherein a first terminal of the second capacitor is coupled to the second terminal of the second switch circuit, and a second terminal of the second capacitor is coupled to the ground voltage.

6. The readout circuit according to the claim 5, wherein the negative voltage is equal to −0.6V.

7. The readout circuit according to the claim 4, further comprising:

a switch capacitor amplifier circuit, coupled between the output terminal of the biasing circuit and the correlated double sampling circuit.

8. The readout circuit according to the claim 7, wherein the switch capacitor amplifier circuit comprises:

a series capacitor, wherein a first terminal of the series capacitor is coupled to the output terminal of the biasing circuit;

an operational amplifier, wherein an inverting input terminal of the operational amplifier is coupled to the second terminal of the series capacitor, a non-inverting input terminal of the operational amplifier is coupled to a reference voltage, and an output terminal of operational amplifier is coupled to the correlated double sampling circuit;

a compensation capacitor, wherein a first terminal of the compensation capacitor is coupled to the inverting input terminal of the operational amplifier, and a second ten al of the compensation capacitor is coupled to the output terminal of the operational amplifier; and a third switch circuit, wherein a first terminal of the third switch circuit is coupled to the inverting input terminal of the operational amplifier, and a second terminal of the third switch circuit is coupled to the output terminal of the operational amplifier.

\* \* \* \* \*